(12) United States Patent
Holzleitner et al.

(10) Patent No.: US 8,674,730 B2
(45) Date of Patent: Mar. 18, 2014

(54) FREQUENCY DIVIDER ARRANGEMENT AND METHOD FOR PROVIDING A QUADRATURE OUTPUT SIGNAL

(75) Inventors: Josef Holzleitner, Wels (AT); Werner Schelmbauer, Steyr (AT)

(73) Assignee: Intel Mobile Communications GmbH, Neubiberg (DE)

( * ) Notice: Subject to any disclaimer, the term of this patent is extended or adjusted under 35 U.S.C. 154(b) by 45 days.

(21) Appl. No.: 13/343,448

(22) Filed: Jan. 4, 2012

(65) Prior Publication Data

US 2012/0169384 A1    Jul. 5, 2012

(30) Foreign Application Priority Data

Jan. 4, 2011    (DE) .......................... 10 2011 002 448

(51) Int. Cl.
*H03B 19/00*    (2006.01)
(52) U.S. Cl.
USPC .............................. 327/117; 327/113; 327/115
(58) Field of Classification Search
USPC ......................................... 327/115, 117, 118
See application file for complete search history.

(56) References Cited

U.S. PATENT DOCUMENTS

| | | | | |
|---|---|---|---|---|
| 6,115,586 | A | * | 9/2000 | Bezzam et al. ............... 455/112 |
| 7,010,287 | B2 | * | 3/2006 | Oh et al. ........................ 455/318 |
| 7,425,850 | B2 | | 9/2008 | Widerin |
| 7,888,978 | B2 | * | 2/2011 | Kuroda .......................... 327/117 |
| 2007/0140645 | A1 | | 6/2007 | Marsili et al. |
| 2007/0279108 | A1 | * | 12/2007 | Trotta ............................ 327/117 |
| 2010/0097106 | A1 | * | 4/2010 | Kravitz ......................... 327/117 |
| 2010/0214031 | A1 | * | 8/2010 | Yamamoto et al. ............. 331/34 |

OTHER PUBLICATIONS

Chen-Wei Huang, et al; "Low-Voltage Miller Divide-by-Three Circuit Integrated With a 1.5-GHz QVCO"; 2008 IEEE, p. 1-4.

* cited by examiner

*Primary Examiner* — John Poos
(74) *Attorney, Agent, or Firm* — Eschweiler & Associates, LLC

(57) ABSTRACT

A frequency divider arrangement for providing a quadrature output signal with a quadrature output signal frequency, includes a signal source for providing a base signal with a base signal frequency at the output side. Further, the frequency divider arrangement includes a first integer number quadrature divider with a first divider ratio for receiving the base signal on the input side and for providing a first quadrature signal with a first quadrature signal frequency according to the first divider ratio of the first integer number quadrature divider.

14 Claims, 4 Drawing Sheets

| n1  | 2 | 2 | 2   | 2    | 2     |
|-----|---|---|-----|------|-------|
| n   | 2 | 4 | 8   | 16   | 32    |
| USB | 2 | 3 | 3,5 | 3,75 | 3,875 |
| LSB | 6 | 5 | 4,5 | 4,25 | 4,125 |

FREQUENCY DIVIDER ARRANGEMENT AND METHOD FOR PROVIDING A QUADRATURE OUTPUT SIGNAL

REFERENCE TO RELATED APPLICATIONS

This application claims priority to German Patent Application No. 102011002448.4, which was filed on Jan. 4, 2011, and is incorporated herein in its entirety by reference.

FIELD

Embodiments of the present invention provide a frequency divider arrangement for providing a quadrature output signal as it may, for example, be used in order to divide down an oscillator signal to a desired frequency. Further embodiments of the present invention provide a method for providing a quadrature output signal as it may, for example, be used in order to divide down a frequency of an oscillator output signal to a desired frequency.

BACKGROUND

Conventional frequency dividers frequently have the disadvantage that they use many passive elements in a so called LO path (local oscillator path) which are area-intensive and thus have the disadvantage that they necessitate a large chip area. Such passive elements in the LO path may, for example, be RC networks (resistor/capacitor networks) in a polyphase filter and LC networks (inductor/capacitor networks). In particular, LC networks may cause undesired coupling effects. Thus, for example, a so-called LC tank in a divider may couple to an LC tank in an oscillator. These area-intensive members lead to high manufacturing costs for those conventional frequency dividers. Further, the undesired couplings lead to performance losses of those conventional frequency dividers.

US 2010/0097106 A1 shows a flexible non-integer frequency divider circuit using at least two mixers each.

SUMMARY

According to an embodiment, a frequency divider arrangement configured to provide a quadrature output signal having a quadrature output signal frequency comprises a signal source configured to provide a base signal with a base signal frequency at the output side, and a first integer number quadrature divider with a first divider ratio configured to receive the base signal at the input side and provide a first quadrature signal with a first quadrature signal frequency according to the first divider ratio of the first integer number quadrature divider. The arrangement further comprises a quadrature mixer arrangement configured to provide a quadrature mixer output signal at the output side based on a first quadrature mixer input signal and a second quadrature mixer input signal, wherein the first quadrature mixer input signal corresponds to the first quadrature signal. An integer number quadrature divider arrangement is also provided and includes a second integer number quadrature divider with a second divider ratio configured to receive the quadrature mixer output signal or a signal having the same frequency derived from the quadrature mixer output signal and for providing the second quadrature mixer input signal and the quadrature output signal at the output side, wherein the second quadrature mixer input signal is derived from the quadrature output signal or corresponds to the same.

According to another embodiment, a frequency divider arrangement configured to provide a quadrature output signal with a quadrature output signal frequency comprises a signal source configured to provide a base signal with a base signal frequency at an output of the signal source, and a first integer number quadrature divider with a first divider ratio. The arrangement further comprises an integer number quadrature divider arrangement including a second integer number quadrature divider with a second divider ratio, and a quadrature mixer arrangement configured to provide a quadrature mixer output signal at an output of the quadrature mixer arrangement based on a first quadrature mixer input signal at a first input of the quadrature mixer arrangement and a second quadrature mixer input signal at a second input of the quadrature mixer arrangement. An output of the first integer number quadrature divider is coupled to the first input of the quadrature mixer arrangement in a signal frequency maintaining way, wherein the output of the quadrature mixer arrangement is coupled to an input of the integer number quadrature divider arrangement in a signal frequency maintaining way. A first output of the integer number quadrature divider arrangement is coupled to the second input of the quadrature mixer arrangement in a signal frequency maintaining way, and the integer number quadrature divider arrangement is implemented to provide the quadrature output signal at the first output of the integer number quadrature divider arrangement or at a second output of the integer number quadrature divider arrangement which is different from the first output.

According to another embodiment, a method for providing a quadrature output signal with a quadrature output signal frequency comprises providing a base signal with a base signal frequency, receiving the base signal, and providing a first quadrature signal with a first quadrature signal frequency according to a first divider ratio based on the base signal. The method further comprises providing a quadrature mixer output signal based on a first quadrature mixer input signal and a second quadrature mixer input signal, wherein the first quadrature mixer input signal corresponds to the first quadrature signal, and providing the second quadrature mixer input signal and the quadrature output signal based on the quadrature mixer output signal and a signal having the same frequency derived from the same. The second quadrature mixer input signal is derived from the quadrature output signal.

Another embodiment may have a computer program including a program code comprising instructions stored on a non-transitory medium for executing the inventive method, when the program is executed on a computer.

Embodiments of the present invention provide a frequency divider arrangement configured to provide a quadrature output signal with a quadrature output signal frequency. The frequency divider arrangement comprises a signal source configured to provide, at the output side, a base signal having a base signal frequency. Further, the frequency divider arrangement comprises a first integer number quadrature divider having a first division or divider ratio configured to receive the base signal at the input side and provide a first quadrature signal having a first quadrature signal frequency according to the first divider ratio of the first integer number quadrature divider. Further, the frequency divider arrangement comprises a quadrature mixer arrangement (for example an in-phase quadrature phase mixer) configured to provide a quadrature mixer output signal at the output side based on a first quadrature mixer input signal and a second quadrature mixer input signal, wherein the first quadrature mixer input signal corresponds to the first quadrature signal.

Further, the frequency divider arrangement comprises an integer number quadrature arrangement which comprises at least a second integer number quadrature divider having a second division ratio. The integer number quadrature divider arrangement is configured to receive the quadrature mixer output signal or a signal derived from the quadrature mixer output signal having the same frequency and provide the second quadrature mixer input signal and the quadrature output signal at the output side. The second quadrature mixer input signal is derived from the quadrature output signal or corresponds to the same.

Embodiments are based on the concept of the feedback of the quadrature mixer output signal to the quadrature mixer arrangement and a frequency division of the quadrature mixer output signal in the feedback path. Further, it was found that quadrature output signals may be realized especially advantageously with integer number quadrature dividers without using costly passive elements like, for example, polyphase filters. Embodiments are thus based on the idea to provide the quadrature output signals for the quadrature mixer arrangement with the help of integer number quadrature dividers. This way, on the one hand, already the desired frequency division may be achieved, and on the other hand the quadrature output signals which are supplied to the quadrature mixer arrangement may be generated comfortably without a high circuit complexity. Further, by the concept of the present invention, a frequency divider arrangement is facilitated that manages with one quadrature mixer arrangement (for example with an in-phase quadrature phase mixer), as the quadrature mixer output signal is provided based on the first quadrature mixer input signal and the second quadrature mixer input signal of the quadrature mixer arrangement. By the feedback of the quadrature mixer output signal and the division of the same in the integer number quadrature divider arrangement, by the selection of the division or divider ratio of the first integer number quadrature divider and the second integer number quadrature divider of the integer number quadrature divider arrangement, different overall divider ratios may be realized between the quadrature output signal frequency and the base signal frequency.

It is one advantage of embodiments of the present invention that by the use of integer number quadrature dividers both for quadrature signal generation and also for frequency division, and by the use of an integer number quadrature divider arrangement, in the feedback path of the quadrature mixer arrangement, a frequency divider arrangement may be provided which comprises both a reduced area consumption and also less coupling effects (due to the use of fewer passive components).

According to some embodiments, an integer number quadrature divider of a frequency divider arrangement is implemented to divide down a signal frequency of a received signal according to a division ratio of the integer number quadrature divider, such that a ratio between the signal frequency of the signal received by the integer number quadrature divider and a signal frequency of a signal provided by the integer number quadrature divider corresponds to the divider ratio of the integer number quadrature divider. In other words, if an integer number quadrature divider can change a signal frequency of a received signal according to its divider ratio, then, for example, an integer number quadrature divider with a divider ratio of 2:1, i.e., a halving means, may halve the signal frequency of the received signal so that the signal frequency of the provided signal is only half of the signal frequency of the received signal.

The divider ratios of integer number quadrature dividers are here typically integer and positive.

According to further embodiments, an integer number quadrature divider may provide separately an in-phase component (for example an I component) and a quadrature phase component (for example an Q component) of a quadrature signal provided by the same, for example at different output terminals. The quadrature phase component of the provided quadrature signal may be phase-shifted (for example by 90°) with respect to the in-phase component of the provided quadrature signal.

According to further embodiments, the integer number quadrature divider arrangement may comprise a third integer number quadrature divider with a third divider ratio. The second integer number quadrature divider of the integer number quadrature divider arrangement is configured to receive the quadrature mixer output signal or the signal derived from the same in order to provide a second quadrature signal (for example in the form of an in-phase component and a quadrature phase component of the second quadrature signal) as the quadrature output signal. Further, the second integer number quadrature divider is configured to provide the second quadrature signal to the third integer number quadrature divider, wherein the third integer number quadrature divider is configured to provide the second quadrature mixer input signal based on the second quadrature signal. The quadrature output signal may thus be the once divided quadrature mixer output signal transformed into a quadrature signal. The second quadrature mixer input signal may thus be the once divided quadrature output signal and thus the twice divided quadrature mixer output signal that was transformed into a quadrature signal. In other words, the quadrature mixer output signal may be divided twice in the feedback path, i.e. in the integer number quadrature divider arrangement, by separate dividers. It is thus facilitated that the quadrature output signal of the frequency divider arrangement has a different frequency to the second quadrature mixer input signal. The divider ratios of the second integer number quadrature divider and the third integer number quadrature divider may here be selected randomly. It may thus be achieved that many different frequency divider ratios are possible using the frequency divider arrangement.

According to further embodiments, the third integer number quadrature divider is configured to provide the quadrature mixer input signal as a further quadrature mixer output signal of the frequency divider arrangement. It is thus enabled to provide different quadrature mixer output signals (for example each with an in-phase component and a quadrature phase component) at different output terminals of the frequency divider arrangement. The quadrature output signal frequency of the quadrature output signal and a further quadrature output signal frequency of the further quadrature output signal may differ by the third divider ratio of the third integer number quadrature divider.

Further embodiments of the present invention may comprise an integer number frequency divider arrangement that selects divider ratios of the integer number quadrature dividers of the frequency divider arrangement so that a ratio between the base signal frequency of the base signal and the quadrature output signal frequency of the quadrature output signal is integer.

BRIEF DESCRIPTION OF THE DRAWINGS

Embodiments of the present invention will be detailed subsequently referring to the appended drawings, in which:

FIG. 3 is an exemplary table for different divider ratios between a quadrature output signal frequency and a base signal frequency depending on the selection of a side band and depending on divider ratios of integer number quadrature dividers of a frequency divider arrangement according to one embodiment.

DETAILED DESCRIPTION

Figure 1:
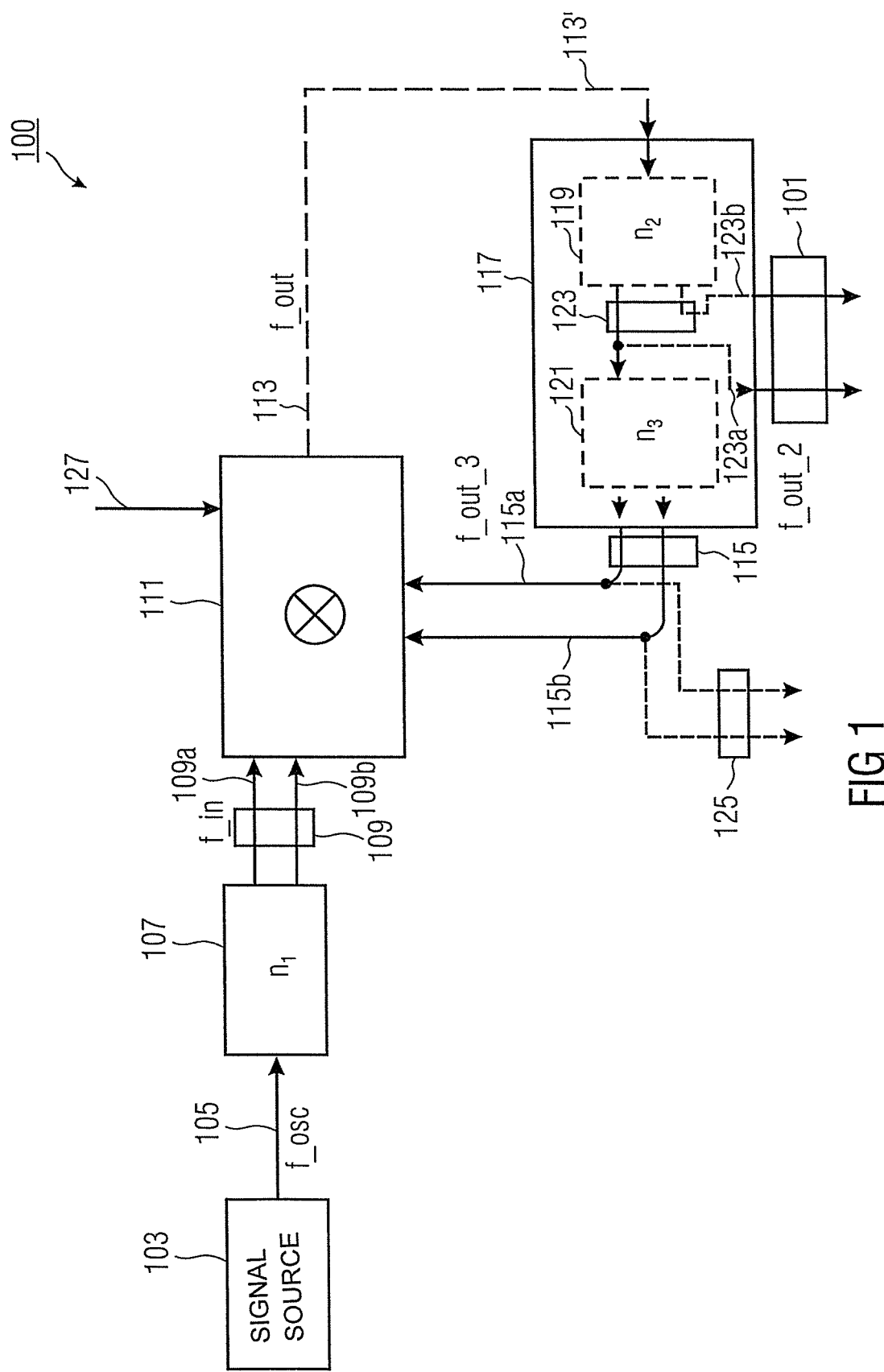
FIG. 1 is a block diagram of a frequency divider arrangement according to one embodiment.

The invention is explained below with reference to the accompanying drawings in the following embodiments. It is noted that like elements or elements having the same function are provided with the same reference numerals and that a repeated description of those elements is omitted. Descriptions of elements having the same reference numerals are thus mutually interchangeable.

FIG. 1 shows a block diagram of a frequency divider arrangement 100 according to one embodiment.

The frequency divider arrangement 100 for providing a quadrature output signal 101 with a quadrature output signal frequency f_out_2 comprises a signal source 103 for providing, at the output side, a base signal 105 with a base signal frequency f_osc. Further, the frequency divider arrangement 100 comprises a first integer number quadrature divider 107 with a first divider ratio $n_1$ for receiving the base signal 105 at the input side and for providing a first quadrature signal 109 with a first quadrature signal frequency f_in. Providing the first quadrature signal 109 with the first quadrature signal frequency f_in is executed according to the first divider ratio $n_1$ of the first integer number quadrature divider 107.

Further, the frequency divider arrangement 100 comprises a quadrature mixer arrangement 111 configured to provide a quadrature mixer output signal at the output side based on a first quadrature mixer input signal 109 and a second quadrature mixer input signal 115, wherein the first quadrature mixer input signal 109 corresponds to the first quadrature signal 109. Further, the frequency divider arrangement 100 comprises an integer number quadrature divider arrangement 117. The integer number quadrature divider arrangement 117 further comprises a second integer number quadrature divider 119. The integer number quadrature divider arrangement 107 is configured to receive the quadrature mixer output signal 113 or a signal 113' having the same frequency derived from the quadrature mixer output signal, and provide the second quadrature mixer input signal 115 and the quadrature output signal 101 at the output side, wherein the second quadrature mixer input signal 115 (with a second quadrature mixer input signal frequency f_out_3) is derived from the quadrature output signal 101 or corresponds to the same.

The base signal 105 provided by the signal source 103 having the base signal frequency f_osc is divided down by the first integer number quadrature divider 107 so that the first quadrature signal 109 with the first quadrature signal frequency f_in results according to the first divider ratio $n_1$ of the first integer number quadrature divider 107:

$$f\_in = \frac{f\_osc}{n_1} \quad (1)$$

The quadrature mixer arrangement 111 combines the first quadrature signal 109 with the second quadrature signal 115 (for example mix the same) in order to acquire the quadrature mixer output signal 113 with a quadrature mixer output signal frequency f_out:

$$f\_out = f\_in \pm f\_out\_3 \quad (2)$$

The integer number quadrature arrangement 117 provides, based on the quadrature mixer output signal 113 or the signal 113' derived from the same having the quadrature mixer output signal frequency f_out (for example by dividing down the quadrature mixer output signal frequency f_out), the second quadrature mixer input signal 115 with the second quadrature mixer input signal frequency f_out_3 (e.g., in an embodiment where another divider 121 is excluded):

$$f\_out\_3 = \frac{f\_out}{n_2} \quad (3)$$

When using only the second integer number quadrature divider 119 with the second divider ratio $n_2$ in the integer number quadrature divider arrangement 117, the quadrature output signal frequency f_out_2 may be selected equal to the second quadrature mixer input signal frequency f_out_3, so that:

$$f\_out\_2 = f\_out\_3 \quad (4)$$

Thus, for the selection of the upper side band, regarding the quadrature mixer arrangement 111 for the overall divider ratio of the frequency divider arrangement the quadrature output signal frequency f_out_2 results depending on the base signal frequency f_osc, as follows:

$$f\_out\_2 = \frac{f\_osc}{n_1(n_2 - 1)} \quad (5)$$

When selecting the lower side band, regarding the quadrature mixer arrangement 111 the overall divider ratio of the frequency divider arrangement between the quadrature output signal frequency f_out_2 and the base signal frequency f_osc results as follows:

$$f\_out\_2 = \frac{f\_osc}{n_1(n_2 + 1)} \quad (6)$$

Thus, for example, for a selection of the first divider ratio $n_1=2$ and the second divider ratio $n_2=4$ for the upper side band, an overall divider ratio of 6 may be achieved, while for the selection of the lower side band an overall divider ratio of 10 may be achieved.

As it is illustrated in FIG. 1 by dashed lines, according to further embodiments, the integer number quadrature divider arrangement 117 may comprise further integer number quadrature dividers. In the embodiment illustrated in FIG. 1, the integer number quadrature divider arrangement 117, in addition to the second integer number quadrature divider 119, comprises a third integer number quadrature divider 121 having a third divider ratio $n_3$. The second integer number quadrature divider 119 is implemented here to receive the quadrature mixer output signal 113 or the signal 113' derived from the same having the quadrature mixer output signal frequency f_out and provide a second quadrature signal 123 to the third integer number quadrature divider 121. The second quadrature signal 123 may correspond to the quadrature output signal 101 having the quadrature output signal frequency f_out_2, or the second quadrature signal 123 and the quadrature output signal 101 may be the same signal. The second quadrature signal 123 may be divided down by the third integer number quadrature divider 121 according to its third divider ratio $n_3$ in order to acquire the second quadrature mixer input signal 115 having the second quadrature mixer input signal frequency f_out_3:

$$f\_out\_3 = \frac{f\_out\_2}{n_3} \quad (7)$$

It may thus be achieved that the quadrature output signal frequency f_out_2 is different than the second quadrature mixer input signal frequency f_out_3, whereby a higher flexibility may be achieved in the selection of the divider ratio of the frequency divider arrangement 100. The overall divider ratio between the quadrature output signal frequency f_out_2 and the base signal frequency f_osc then results using the upper side band in the quadrature mixer arrangement 111, as follows:

$$f\_out\_2 = \frac{f\_osc * n_3}{(n_2 n_3 - 1)n_1} \quad (8)$$

For the lower side band, the following results:

$$f\_out\_2 = \frac{f\_osc * n_3}{(n_2 n_3 + 1)n_1} \quad (9)$$

Thus, with a selection of the divider ratios $n_1$, $n_2$, $n_3$=2 for the upper sideband an overall divider ratio of 3 may be achieved and for the lower side band an overall divider ratio of 5 may be achieved.

Further, the second quadrature mixer input signal 115 provided by the third integer number quadrature divider 121 may be provided as a further quadrature output signal 125 of the frequency divider arrangement with a further quadrature output signal frequency f_out_3 which corresponds to the second quadrature mixer input signal frequency f_out_3. A ratio between the quadrature output signal frequency f_out_2 of the quadrature output signal 101 and the further quadrature output signal frequency f_out_3 of the further quadrature output signal 115 here corresponds to the third divider ratio $n_3$ of the third integer number quadrature divider 121. By using the third integer number quadrature divider 121 in the integer number quadrature divider arrangement 117, it is thus facilitated in a simple way to acquire a further quadrature output signal (the further quadrature output signal 125) at a further output of the integer number quadrature divider arrangement 100.

According to further embodiments, the frequency divider arrangement 100 illustrated in FIG. 1 may be an integer number frequency divider arrangement, i.e. an overall divider ratio of the frequency divider arrangement 100 between the quadrature output signal frequency f_out_2 and the base signal frequency f_osc is an integer. In other words, the divider ratios $n_1$, $n_2$, $n_3$ of the integer number quadrature dividers 107, 119, 121 may be selected so that the overall divider ratio of the frequency divider arrangement 100 is an integer.

According to some embodiments, for example the first divider ratio $n_1$ of the first integer number quadrature divider 107 may be selected equal to the third divider ratio $n_3$ of the third integer number quadrature divider 121 in order to acquire an integer overall divider ratio of the frequency divider arrangement 100.

According to further embodiments, one or several of the integer number quadrature dividers 107, 119, 121 of the frequency divider arrangement 100 may be implemented to provide an in-phase component (I component) and a quadrature phase component (Q component) of the output signals. The quadrature phase component of a provided signal may here be phase-shifted (for example 90° phase-shifted) with respect to the in-phase component of the provided output signal.

Thus, for example, the first quadrature divider 107 may provide an in-phase component 109a and a quadrature phase component 109b of the first quadrature signal 109 or the first quadrature mixer input signal 109. Further, the quadrature divider arrangement 117 may provide an in-phase component 115a and a quadrature phase component 115b of the second quadrature mixer input signal 115. In the example illustrated in FIG. 1, the in-phase component 115a and the quadrature phase component 115b of the second quadrature mixer input signal 115 may be provided by the third integer number quadrature divider 121. Further, the second integer number quadrature divider 119 may provide an in-phase component 123a as well as a quadrature phase component 123b of the second quadrature signal 123 and thus the quadrature output signal 101.

In other words, both the quadrature output signal 101 and also the further quadrature output signal 125 may be provided with an in-phase component and a quadrature phase component at outputs of the frequency divider arrangement 100.

The quadrature mixer arrangement 111 may be implemented to receive the in-phase component 109a and the quadrature phase component 109b of the first quadrature mixer input signal 109 and the in-phase component 115a and the quadrature phase component 115b of the second quadrature mixer input signal 115, in order to provide the quadrature mixer output signal 113 based on these in-phase components and quadrature phase components (for example by a selective mixing of the in-phase components and quadrature components and by a subsequent combining of the mixed signals).

According to some embodiments, some or several of the integer number quadrature dividers 107, 119, 121 may be implemented to provide an output signal only based on an in-phase component or quadrature phase component of an input signal.

This way, for example, the third integer number quadrature divider 121 may, for example, be implemented to provide the second quadrature mixer input signal 115 either based on the in-phase component 123a of the second quadrature signal 123 or based on the quadrature phase component 123b of the second quadrature signal 123. In the example illustrated in FIG. 1, the third integer number quadrature divider 121 is implemented to provide the second quadrature mixer input signal 115 based on the in-phase component 123a of the second quadrature signal 123.

As it was already explained above, the quadrature mixer arrangement 111 may choose an upper or a lower side band in determining the quadrature mixer output signal 113. This may, for example, be executed depending on a side band selection signal 127.

In the following, the structure of the frequency divider arrangement 100 illustrated in FIG. 1 is to be summarized again briefly.

FIG. 1 shows the frequency divider arrangement 100 for providing the quadrature output signal 101 with the quadrature output signal frequency f_out_2. The frequency divider arrangement 100 comprises the signal source 103 for providing the base signal 105 with the base signal frequency f_osc as an output of the signal source. Further, the frequency divider arrangement 100 comprises the first integer number quadrature divider 107 with the first divider ratio $n_1$. Further, the frequency divider arrangement 100 comprises the integer number quadrature divider arrangement 117 which comprises the second integer number quadrature divider 119 with the second divider ratio $n_2$. In the embodiment illustrated in FIG. 1, the integer number quadrature divider arrangement further comprises the optional third integer number quadrature divider 121 with the third divider ratio $n_3$.

Further, the frequency divider arrangement 100 comprises the quadrature mixer arrangement 111 for providing the quadrature mixer output signal 113 at an output of the quadrature mixer arrangement 111. The quadrature mixer arrangement 111 is implemented to provide the quadrature mixer output signal 113 that, in one embodiment, is exclusively based on the first quadrature mixer input signal 109 at a first input of the quadrature mixer arrangement 111 and on the second quadrature mixer input signal 115 at a second input of the quadrature mixer arrangement 111.

An output of the first integer number quadrature divider 107 is coupled to the first input of the quadrature mixer arrangement 111 in a signal-frequency maintaining way. The output of the quadrature mixer arrangement 111 is coupled to an input of the integer number quadrature divider arrangement 117 in a signal-frequency maintaining way. A first output of the integer number quadrature divider arrangement 117 is coupled to the second input of the quadrature mixer arrangement 111 in a signal-frequency maintaining way. The integer number quadrature divider arrangement 117 is here implemented to provide the quadrature output signal 101 at the first output of the integer number quadrature divider arrangement 117 (for example when the quadrature output signal 101 is equal to the second quadrature mixer input signal 115) or at a second output of the integer number quadrature divider arrangement which is different from the first output (for example when the quadrature output signal 101 is different from the second quadrature mixer input signal 115).

In the sense of the present application, a signal-frequency maintaining coupling is a direct low-impedance coupling and an indirect coupling to one or several interconnected devices, so that a signal at a second circuit node depends on a signal at a first circuit node that is coupled to the second circuit node, and that a frequency of the signal at the first circuit node is equal (apart from parasitic effects) to a frequency of the signal at the second circuit node. In other words, between two terminals coupled to each other, further devices, in particular passive non-frequency changing devices, like, for example, resistors or capacitors, or switching paths of active members, like, for example, switches or transistors, but also active non-frequency changing members like amplifiers may be connected. With terminals coupled to each other, a member or component may be connected between those terminals, but need not be, so that two terminals coupled to each other may also be directly connected to each other (i.e. by a low impedance conductive connection).

Figure 2:
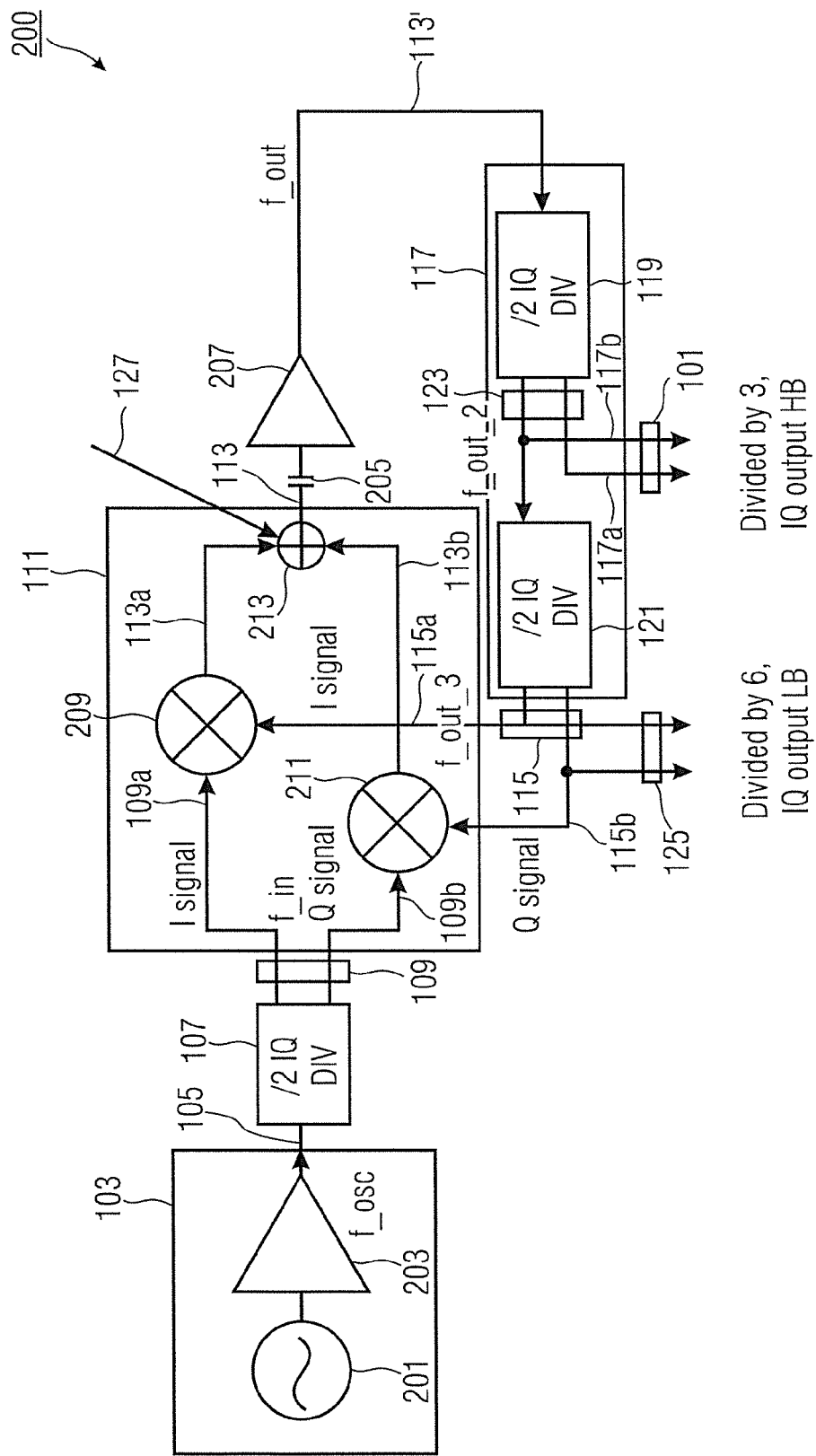
FIG. 2 is a block diagram of a frequency divider arrangement according to a further embodiment.

FIG. 2 shows a block diagram of a frequency divider arrangement 200 according to a further embodiment.

The frequency divider arrangement 200 illustrated in FIG. 2 corresponds to the frequency divider arrangement 100 illustrated in FIG. 1 regarding its function, wherein the frequency divider arrangement 200 comprises the additional, optional features illustrated in FIG. 2.

The frequency divider arrangement 200 illustrated in FIG. 2 is different from the frequency divider arrangement 100 illustrated in FIG. 1 as the divider ratios $n_1$, $n_2$, $n_3$ of the three integer number quadrature dividers 107, 119, 121=2 are selected, whereby (selecting the upper side band) an overall divider ratio of the frequency divider arrangement 200 between the quadrature output signal frequency f_out_2 and the basic signal frequency f_osc is set to 3 and an overall divider ratio between the further quadrature output signal frequency f_out_3 and the base signal frequency f_osc is set to 6.

Further, the signal source 103 comprises an oscillator 201 and a first amplifier 203 to provide the base signal 105 with the base signal frequency f_osc.

Further, the output of the quadrature mixer arrangement 111, at which the quadrature mixer output signal 113 with the quadrature mixer output signal frequency f_out is provided, is coupled in a signal-frequency maintaining way, via a coupling capacitor 205 and an amplifier 207 connected in series with the coupling capacitor 205, to the input of the integer number quadrature divider arrangement 117. The signal 113' derived from the quadrature output signal 113 is thus an amplified and DC-free (via the coupling capacitor) version of the quadrature mixer output signal 113 having the quadrature mixer output signal frequency f_out.

Further, the quadrature mixer arrangement 111 is implemented as an in-phase/quadrature phase mixer 111, the in-phase/quadrature phase mixer 111 comprises an in-phase component mixer 209 and a quadrature phase component mixer 211. Further, the in-phase/quadrature phase mixer 111 comprises a combiner 213. The in-phase component mixer 209 is implemented to combine the in-phase component 109a of the first quadrature mixer input signal 109 with the in-phase component 115a of the second quadrature mixer input signal 115 (for example mix the same or multiply the same in the time range) in order to acquire an in-phase component 113a of the quadrature mixer output signal 113. The quadrature phase component mixer 211 is implemented to combine the quadrature phase component 109b of the first quadrature mixer input signal 109 with the quadrature phase component 115b of the second quadrature mixer input signal 115 (for example mix the same or multiply the same in the time range), to acquire a quadrature phase component 113b of the quadrature mixer output signal 113. In other words, the in-phase/quadrature phase mixer 111 is implemented to combine the in-phase components 109a, 115a and the quadrature phase components 109b, 115b of the two quadrature mixer input signals 109, 115 separate from each other in order to acquire the in-phase component 113a and the quadrature phase component 113b of the quadrature mixer output signal 113 separate from each other.

The combiner 213 is implemented to combine the in-phase component 113a and the quadrature phase component 113b of the quadrature-mixer output signal 113 (for example to add or subtract the same in the time range). Depending on the side band selection signal 127, the combiner 213 may add the in-phase component 113a and the quadrature phase component 113b of the quadrature mixer output signal 113 or subtract the same from each other (for example, the combiner 213 may subtract the quadrature phase component 113b from the in-phase component 113a of the quadrature mixer output signal 113).

In other words, the quadrature mixer arrangement 111 or the in-phase/quadrature phase mixer 111 is implemented to mix the in-phase component 109a of the first quadrature mixer input signal 109 (or the first quadrature signal 109) with the in-phase component 115a of the second quadrature mixer input signal 115 in order to acquire the in-phase component 113a of the quadrature mixer output signal 113. Further, the quadrature mixer arrangement 111 (or the in-phase/quadrature phase mixer 111) is implemented to mix the quadrature phase component 109b of the first quadrature mixer input signal 109 (or the first quadrature signal 109) with the quadrature phase component 115b of the second quadrature mixer input signal 115 in order to acquire the quadrature phase component 113b of the quadrature mixer output signal 113. In particular, mixing the in-phase components may take place separately from mixing the quadrature phase components.

Further, the quadrature mixer arrangement 111 (or the in-phase/quadrature phase mixer 111) is implemented to combine the in-phase component 113a of the quadrature mixer output signal 113 with the quadrature phase component 113b of the quadrature mixer output signal 113 (for example to add or subtract the same) in order to acquire the quadrature mixer output signal 113. The quadrature mixer arrangement 111 (or the in-phase/quadrature phase mixer 111) may add the in-phase component 113a of the quadrature mixer output signal 113 with the quadrature phase component 113b of the quadrature mixer output signal 113 or may subtract the quadrature phase component 113b of the quadrature mixer output signal 113 from the in-phase component 113a of the quadrature mixer output signal depending on the side band selection signal 127 in order to acquire the (combined) quadrature mixer output signal 113.

The concept illustrated in FIG. 2 is based on the feedback of the mixer output (the output of the in-phase/quadrature phase mixer 111) to the second mixer input (to the second input of the in-phase/quadrature phase mixer 111) and a frequency division (by the integer number quadrature divider arrangement 117) in the feedback path. With the concept illustrated in FIG. 2, a division by ⅔ is aimed at, to enable, upstream from the mixer (upstream from the first input of the in-phase/quadrature phase mixer 111) and at the mixer output, the IQ generation (the generation of the in-phase and quadrature phase components) in a comfortable way with a divider by two (with the first integer number quadrature divider 107 and the second integer number quadrature divider 119). The overall divider ratio then again is set to 3, as it will be illustrated in more detail below.

It was found that when both input signals (both the first quadrature mixer input signal 109 and also the second quadrature mixer input signal 115) are present as quadrature signals, at the mixer output an unwanted side band may be sufficiently suppressed (so-called SSB-mixer, Single Side Band Mixer).

The in-phase/quadrature phase mixer 111 thus executes the following calculation:

$$\cos(\omega_1 t)*\cos(\omega_2 t) \pm \sin(\omega_1 t)*\sin(\omega_2 t) = \cos(\omega_1 t \mp \omega_2 t) \quad (10)$$

Here, $\omega_1$ corresponds to the first quadrature mixer input signal frequency f_in of the first quadrature mixer input signal 109 and $\omega_2$ corresponds to the second quadrature mixer input signal frequency f_out_3 of the second quadrature mixer input signal 115. The cosine terms here represent the in-phase components 109a, 115a of the first quadrature mixer input signal 109 or the second quadrature mixer input signal 115. The sine terms represent the quadrature phase components 109b, 115b of the first quadrature mixer input signal 109 or the second quadrature mixer input signal 115. The multiplication of the cosine terms is here executed by the in-phase component mixer 209, while the multiplication of the sine terms is executed by the quadrature phase mixer 211. The addition or subtraction of the resulting in-phase component 113a and the resulting quadrature phase component 113b of the quadrature mixer output signal 113 is executed by the combiner 213.

The overall divider ratio of the embodiment illustrated in FIG. 2 may be calculated using the following formulae:

$$f\_out = f\_in \pm f\_out\_3 \quad (11)$$

$$f\_out = f\_in \pm f\_out/4 \quad (12)$$

In this exemplary case, the upper side band is selected:

$$f\_out = f\_in \pm f\_out\_3 \quad (13)$$

$$f\_out = \frac{1}{0,75} f\_in \quad (14)$$

The desired output signal (the quadrature output signal 101) is a signal f_out divided by 2. Or in other words, the quadrature output signal frequency f_out_2 corresponds to half of the quadrature mixer output signal frequency f_out of the quadrature mixer output signal 113:

$$f\_out\_2 = \frac{2}{3} f\_in \quad (15)$$

The mixer input signal 109 (or the first quadrature signal 109 or the first quadrature mixer input signal 109) with the first quadrature mixer input signal frequency f_in is an oscillator signal already divided by 2, and thus a divider ratio of 3 results from the oscillator 201 to the quadrature output signal 101 having the quadrature output signal frequency f_out.

If the lower side band were selected at the mixer output, a divider ratio of 5 would be provided.

Further, using this topology presented, by different divider ratios in the feedback path (in the integer number quadrature divider arrangement 117) and the selective selection of the upper or lower mixing products (in the quadrature mixer arrangement 111), many different divider ratios may be realized.

In the following, the above illustrated formulae are again to be illustrated generally, wherein it is assumed here that n is the overall divider ratio of the integer number quadrature divider 117. Thus, in the case illustrated in FIG. 2 the following applies:

$$n = n_2 * n_3 \quad (16)$$

Assuming that the first divider ratio $n_1=2$ is selected, the quadrature output signal frequency f_out results as follows:

$$f\_out = f\_in \pm f\_out/n \quad (17)$$

$$\frac{f\_out}{f\_in} = \frac{n}{(n \mp 1)} \quad (18)$$

$$\frac{f\_out}{f\_osc} = \frac{n}{2(n \mp 1)} \quad (19)$$

It was found out that in order to be able to use the quadrature mixer output signal 113 as the IQ LO signal (in-phase/quadrature phase local oscillator signal), the quadrature mixer output signal 113 may again be divided using an IQ DIV 2 (using the second integer number quadrature divider 119). This following part is introduced as $n_{DIV}$ into the following calculation rule.

This leads to the following divider ratios:

$$\frac{f\_out\_2}{f\_osc} = \frac{n}{2 * n_{DIV} * (n \mp 1)} \qquad (20)$$

In a table, FIG. 3 shows an exemplary selection of different divider ratios between the quadrature output signal frequency f_out_2 and the base signal frequency f_osc depending on the overall divider ratio n of the integer number quadrature divider arrangement 117 and the first divider ratio $n_1$ of the first integer number quadrature divider 107 of the frequency divider arrangement 100 according to FIG. 1, selecting the upper side band (USB) or the lower side band (LSB).

Figure 4:
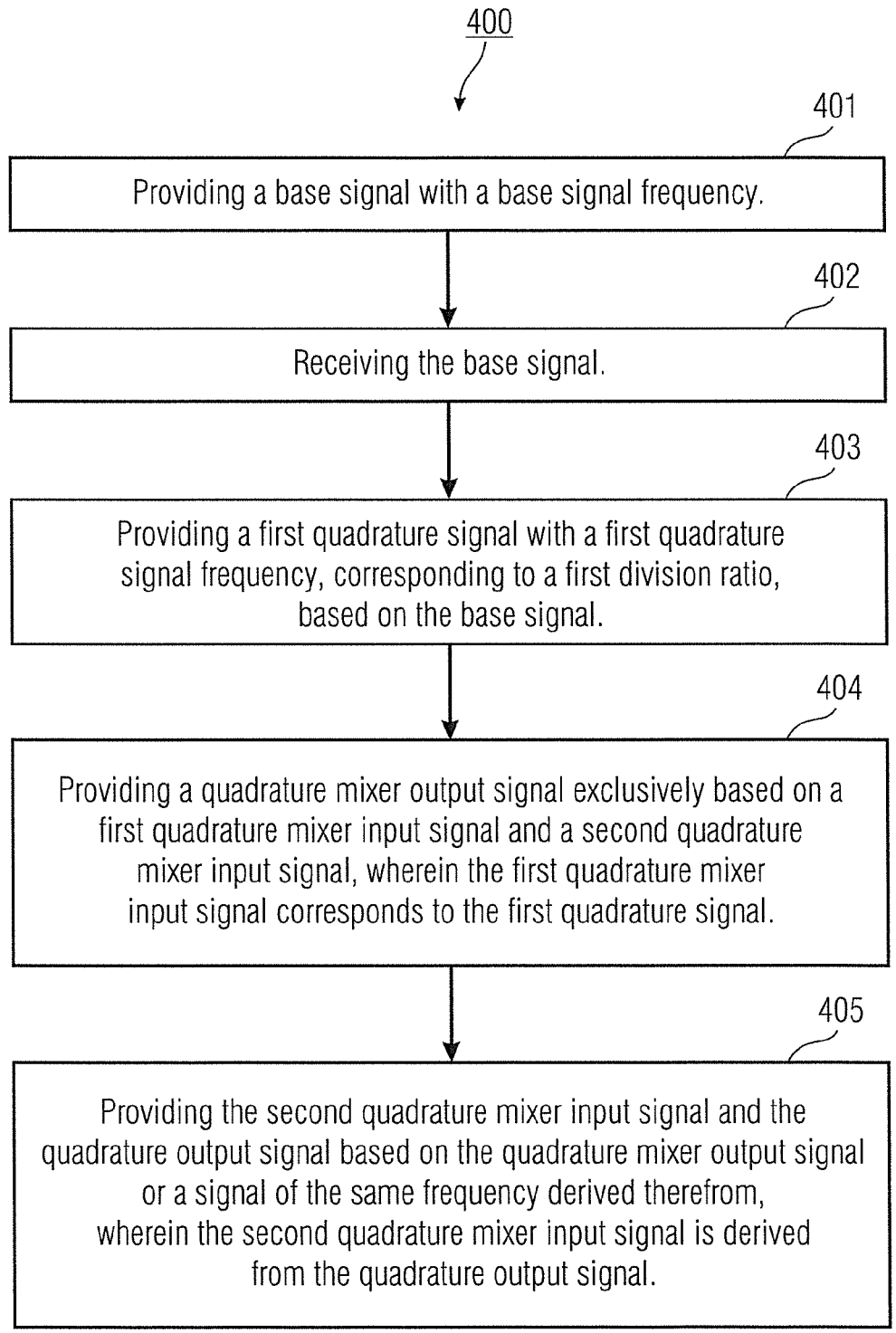
FIG. 4 is a flowchart of a method according to one embodiment.

FIG. 4 shows a flowchart of a method 400 for providing a quadrature output signal having a quadrature output signal frequency.

The method 400 comprises a step 401 of providing a base signal having a base signal frequency. Further, the method 400 comprises a step 402 of receiving the base signal. Further, the method comprises a step 403 of providing a first quadrature signal with a first quadrature signal frequency corresponding to a first divider ratio based on the base signal.

Further, the method 400 includes a step 404 of providing a quadrature mixer output signal based on a first quadrature mixer input signal and a second quadrature mixer input signal, wherein the first quadrature mixer input signal corresponds to the first quadrature signal. In one embodiment the quadrature mixer output signal is based exclusively on the first and second quadrature mixer input signals.

Further, the method 400 includes a step 405 of providing the second quadrature mixer input signal and the quadrature output signal based on the quadrature mixer output signal or a signal derived from the same having the same frequency, wherein the second quadrature mixer input signal is derived from the quadrature signal.

In the following, some aspects of embodiments are to be summarized.

Compared to conventional concepts, wherein a division by 3 is achieved by IQ generation at a VCO output (Voltage Controlled Oscillator) or a quadrature oscillator and a subsequent division by 1.5, in embodiments here complex components like voltage controlled oscillators and quadrature oscillators may be omitted. With such conventional concepts, the division by 1.5 may be achieved by a feedback of the output signal divided by 2 to the second mixer input. The division by 2 in the feedback then leads to a division by 3. To operate an SSB mixer concept, the divider by 2 may be implemented in the feedback path as a quadrature divider (as the SSB mixer concept typically necessitates quadrature input signals). Another solution is to filter away the undesired side band by an LC filter network, which is area-intensive, however, and may lead to possibly unwanted coupling effects.

Although some aspects were described in connection with a device, it is obvious that those aspects also represent a description of the corresponding method, so that a block or a member of a device may also be regarded as a corresponding method step or as a feature of a method step. Analogue to that, aspects described in connection with or as a method step also represent a description of a corresponding block or detail of feature of a corresponding device.

Depending on certain implementation requirements, embodiments of the invention may be implemented in hardware or in software. The implementation may be executed using a non-transitory digital storage medium, for example a floppy disc, a DVD, a Blu-ray disc, a CD, an ROM, a PROM, an EPROM, an EEPROM or a FLASH memory, a hard disc or another magnetic or optic memory on which electronically readable control signals are stored which may cooperate with a programmable computer system such that the respective method is executed. Thus, the digital storage medium may be computer-readable. Some embodiments according to the invention thus include a data carrier comprising electronically readable control signals that are capable of cooperating with a programmable computer system such that one of the methods described herein is executed.

In general, embodiments of the present invention may be implemented as a computer program product having a program code, wherein the program code is effective in order to execute one of the methods when the computer program product is executed on a computer. The program code may for example be stored on a non-transitory machine readable carrier.

Other embodiments include the computer program for executing one of the methods described herein, wherein the computer program is stored on a non-transitory machine readable carrier. In other words, one embodiment of the inventive method thus is a computer program comprising a program code for executing one of the methods described herein, when the computer program is executed on a computer. A further embodiment of the inventive method thus is a non-transitory data carrier (or a digital storage medium or a computer readable medium), on which the computer program for executing one of the methods described herein is stored.

A further embodiment of the inventive method thus is a data stream or a sequence of signals representing the computer program for executing one of the methods described herein. The data stream or the sequence of signals may, for example, be configured in order to be transferred via a data communication connection, for example via the internet.

A further embodiment includes a processing means, for example a computer or a programmable logic device which is configured or adapted to execute one of the methods described herein.

Another embodiment includes a computer on which the computer program for executing one of the methods described herein is installed.

With some embodiments, a programmable logic device (for example a field-programmable gate array, an FPGA) may be used to execute some or all functionalities of the methods described herein. In some embodiments, a field-programmable gate array may cooperate with a microprocessor to execute one of the methods described herein. In general, in some embodiments the methods are executed by any hardware device. The same may be a universally applicable hardware like a computer processor (CPU) or hardware which is specific for the method, like for example an ASIC.

While this invention has been described in terms of several advantageous embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A frequency divider arrangement for providing a quadrature output signal comprising a quadrature output signal frequency, comprising:

a signal source configured to provide a base signal having a base signal frequency;

a first integer number quadrature divider with a first divider ratio configured to receive the base signal and provide a first quadrature signal having a first quadrature signal frequency according to the first divider ratio of the first integer number quadrature divider;

a quadrature mixer arrangement configured to provide a quadrature mixer output signal at the output side based on a mixing of a first quadrature mixer input signal and a second quadrature mixer input signal, wherein the first quadrature mixer input signal corresponds to the first quadrature signal; and an integer number quadrature divider arrangement comprising a second integer number quadrature divider with a second divider ratio configured to receive the quadrature mixer output signal or a signal comprising a same frequency derived from the quadrature mixer output signal and provide the second quadrature mixer input signal and the quadrature output signal that are divided, unmixed versions of the quadrature mixer output signal, wherein the second quadrature mixer input signal is derived from the quadrature output signal or corresponds to the quadrature output signal.

2. A frequency divider arrangement for providing a quadrature output signal comprising a quadrature output signal frequency, comprising:

a signal source configured to provide a base signal having a base signal frequency;

a first integer number quadrature divider with a first divider ratio configured to receive the base signal and provide a first quadrature signal having a first quadrature signal frequency according to the first divider ratio of the first integer number quadrature divider;

a quadrature mixer arrangement configured to provide a quadrature mixer output signal at the output side based on a first quadrature mixer input signal and a second quadrature mixer input signal, wherein the first quadrature mixer input signal corresponds to the first quadrature signal; and an integer number quadrature divider arrangement comprising a second integer number quadrature divider with a second divider ratio configured to receive the quadrature mixer output signal or a signal comprising a same frequency derived from the quadrature mixer output signal and provide the second quadrature mixer input signal and the quadrature output signal that are divided, unmixed versions of the quadrature mixer output signal, wherein the second quadrature mixer input signal is derived from the quadrature output signal or corresponds to the quadrature output signal, wherein the integer number quadrature divider arrangement further comprises a third integer number quadrature divider with a third divider ratio;

wherein the second integer number quadrature divider is configured to receive the quadrature mixer output signal or the signal derived from the same and provide a second quadrature signal as the quadrature output signal based on the second divider ratio, and provide the second quadrature signal to the third integer number quadrature divider, wherein the third integer number quadrature divider is configured to provide the second quadrature mixer input signal based on the second quadrature signal according to the third divider ratio.

3. The frequency divider arrangement according to claim 2, wherein the second integer number quadrature divider is configured to provide an in-phase component and a quadrature phase component of the second quadrature signal.

4. The frequency divider arrangement according to claim 3, wherein the third integer number quadrature divider is configured to provide the second quadrature mixer input signal based either on the in-phase component of the second quadrature signal or on the quadrature component of the second quadrature signal.

5. The frequency divider arrangement according to claim 2, wherein the third integer number quadrature divider is configured to provide the second quadrature input mixer signal as a further quadrature output signal frequency such that a ratio between the quadrature output signal frequency of the quadrature output signal and the further quadrature output signal frequency of the further quadrature output signal corresponds to the third divider ratio of the third integer number quadrature divider.

6. A frequency divider arrangement for providing a quadrature output signal comprising a quadrature output signal frequency, comprising:

a signal source configured to provide a base signal having a base signal frequency;

a first integer number quadrature divider with a first divider ratio configured to receive the base signal and provide a first quadrature signal having a first quadrature signal frequency according to the first divider ratio of the first integer number quadrature divider;

a quadrature mixer arrangement configured to provide a quadrature mixer output signal at the output side based on a first quadrature mixer input signal and a second quadrature mixer input signal, wherein the first quadrature mixer input signal corresponds to the first quadrature signal; and an integer number quadrature divider arrangement comprising a second integer number quadrature divider with a second divider ratio configured to receive the quadrature mixer output signal or a signal comprising a same frequency derived from the quadrature mixer output signal and provide the second quadrature mixer input signal and the quadrature output signal that are divided versions of the quadrature mixer output signal, wherein the second quadrature mixer input signal is derived from the quadrature output signal or corresponds to the quadrature output signal, wherein an overall divider ratio of the integer number quadrature divider arrangement and the first divider ratio of the first integer number quadrature divider are selected such that a ratio between the base signal frequency of the base signal and the quadrature output signal frequency of the quadrature output signal is an integer.

7. A frequency divider arrangement for providing a quadrature output signal comprising a quadrature output signal frequency, comprising:

a signal source configured to provide a base signal having a base signal frequency;

a first integer number quadrature divider with a first divider ratio configured to receive the base signal and provide a first quadrature signal having a first quadrature signal frequency according to the first divider ratio of the first integer number quadrature divider;

a quadrature mixer arrangement configured to provide a quadrature mixer output signal at the output side based on a first quadrature mixer input signal and a second quadrature mixer input signal, wherein the first quadrature mixer input signal corresponds to the first quadrature signal; and an integer number quadrature divider arrangement comprising a second integer number quadrature divider with a second divider ratio configured to receive the quadrature mixer output signal or a signal comprising a same frequency derived from the quadrature mixer output signal and provide the second quadrature mixer input signal and the quadrature output signal that are divided versions of the quadrature mixer output signal, wherein the second quadrature mixer input signal is derived from the quadrature output signal or corresponds to the quadrature output signal, wherein the integer number quadrature divider arrangement further comprises a third integer number quadrature divider with a third divider ratio, wherein the third divider ratio of the third integer number quadrature divider is identical to the first divider ratio of the first integer number quadrature divider such that a ratio between the base signal frequency of the base signal and the quadrature output signal frequency of the quadrature output signal is an integer.

8. A frequency divider arrangement for providing a quadrature output signal comprising a quadrature output signal frequency, comprising:

a signal source configured to provide a base signal having a base signal frequency;

a first integer number quadrature divider with a first divider ratio configured to receive the base signal and provide a first quadrature signal having a first quadrature signal frequency according to the first divider ratio of the first integer number quadrature divider;

a quadrature mixer arrangement configured to provide a quadrature mixer output signal at the output side based on a first quadrature mixer input signal and a second quadrature mixer input signal, wherein the first quadrature mixer input signal corresponds to the first quadrature signal; and an integer number quadrature divider arrangement comprising a second integer number quadrature divider with a second divider ratio configured to receive the quadrature mixer output signal or a signal comprising a same frequency derived from the quadrature mixer output signal and provide the second quadrature mixer input signal and the quadrature output signal that are divided, unmixed versions of the quadrature mixer output signal, wherein the second quadrature mixer input signal is derived from the quadrature output signal or corresponds to the quadrature output signal, wherein the first integer number quadrature divider is configured to provide an in-phase component and a quadrature phase component of the first quadrature output signal;

wherein the integer number quadrature divider arrangement is configured to provide an in-phase component and a quadrature phase component of the second quadrature mixer input signal; and wherein the quadrature mixer arrangement is configured to mix the in-phase component of the first quadrature signal with the in-phase component of the second quadrature mixer input signal to acquire an in-phase component of the quadrature mixer output signal, and mix the quadrature phase component of the first quadrature signal with the quadrature phase component of the second quadrature mixer input signal to acquire a quadrature phase component of the quadrature mixer output signal.

9. The frequency divider arrangement according to claim 8, wherein the quadrature mixer arrangement is configured to combine the in-phase component of the quadrature mixer output signal with the quadrature phase component of the quadrature mixer output signal to acquire the quadrature mixer output signal.

10. The frequency divider arrangement according to claim 9, wherein the quadrature mixer arrangement is configured to add the in-phase component of the quadrature mixer output signal with the quadrature phase component of the quadrature mixer output signal or to subtract the quadrature phase component of the quadrature mixer output signal from the in-phase component of the quadrature mixer output signal based on a side band selection signal.

11. A frequency divider arrangement for providing a quadrature output signal comprising a quadrature output signal frequency, comprising:

a signal source configured to provide a base signal having a base signal frequency;

a first integer number quadrature divider with a first divider ratio configured to receive the base signal and provide a first quadrature signal having a first quadrature signal frequency according to the first divider ratio of the first integer number quadrature divider;

a quadrature mixer arrangement configured to provide a quadrature mixer output signal at the output side based on a first quadrature mixer input signal and a second quadrature mixer input signal, wherein the first quadrature mixer input signal corresponds to the first quadrature signal; and an integer number quadrature divider arrangement comprising a second integer number quadrature divider with a second divider ratio configured to receive the quadrature mixer output signal or a signal comprising a same frequency derived from the quadrature mixer output signal and provide the second quadrature mixer input signal and the quadrature output signal that are divided versions of the quadrature mixer output signal, wherein the second quadrature mixer input signal is derived from the quadrature output signal or corresponds to the quadrature output signal, wherein an integer number quadrature divider of the frequency divider arrangement including the second integer number quadrature divider is configured to divide down a signal frequency of a received signal comprising the quadrature mixer output signal according to a divider ratio of the integer number quadrature divider such that a ratio between the signal frequency of the signal received from the integer number quadrature divider and a signal frequency of a signal provided by the integer number quadrature divider corresponds to the divider ratio of the integer number quadrature divider.

12. A frequency divider arrangement for providing a quadrature output signal with a quadrature output signal frequency, comprising:

a signal source configured to provide a base signal having a base signal frequency;

a first integer number quadrature divider with a first divider ratio configured to divide the base signal based on the first divider ratio to form a first quadrature signal;

an integer number quadrature divider arrangement comprising a second integer number quadrature divider with a second divider ratio; and a quadrature mixer arrangement configured to provide a quadrature mixer output signal at an output of the quadrature mixer arrangement based on a mixing of the first quadrature mixer input signal and a second quadrature mixer input signal from the integer number quadrature divider arrangement;

wherein the integer number quadrature divider arrangement is configured to divide the quadrature mixer output signal based on at least the second divider ratio;

wherein an output of the first integer number quadrature divider is coupled to a first input of the quadrature mixer arrangement in a signal frequency maintaining way;

wherein an output of the quadrature mixer arrangement is coupled to an input of the integer number quadrature divider arrangement in a signal frequency maintaining way;

wherein a first output of the integer number quadrature divider arrangement is coupled to a second input of the quadrature mixer arrangement in a signal frequency maintaining way; and wherein the integer number quadrature divider arrangement is configured to provide the quadrature output signal at the first output of the integer number quadrature divider arrangement or at a second output of the integer number quadrature divider arrangement which is different from the first output.

13. A method for providing a quadrature output signal with a quadrature output signal frequency, comprising:

receiving a base signal with a base signal frequency;

providing a first quadrature signal with a first quadrature signal frequency according to a first divider ratio based on the base signal;

providing a quadrature mixer output signal based on a mixing of a first quadrature mixer input signal and a second quadrature mixer input signal, wherein the first quadrature mixer input signal corresponds to the first quadrature signal; and providing the second quadrature mixer input signal and the quadrature output signal based on the quadrature mixer output signal or a signal of the same frequency derived therefrom, wherein the second quadrature mixer input signal is derived from the quadrature output signal without mixing.

14. A computer program comprising a program code on a non-transitory medium for executing the method for providing a quadrature output signal with a quadrature output signal frequency, the method comprising:

receiving a base signal with a base signal frequency;

providing a first quadrature signal with a first quadrature signal frequency according to a first divider ratio based on the base signal;

providing a quadrature mixer output signal based on a mixing of a first quadrature mixer input signal and a second quadrature mixer input signal, wherein the first quadrature mixer input signal corresponds to the first quadrature signal; and providing the second quadrature mixer input signal and the quadrature output signal based on the quadrature mixer output signal or a signal of the same frequency derived therefrom, wherein the second quadrature mixer input signal is derived from the quadrature output signal without mixing, when the program is executed on a computer.

\* \* \* \* \*